(12) United States Patent
Bagger

(10) Patent No.: US 8,818,310 B2
(45) Date of Patent: Aug. 26, 2014

(54) NOISE REDUCTION AND TILT REDUCTION IN PASSIVE FET MULTI-PHASE MIXERS

(75) Inventor: Reza Bagger, Järfälla (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 127 days.

(21) Appl. No.: 13/581,991

(22) PCT Filed: Jun. 27, 2012

(86) PCT No.: PCT/SE2012/050724
§ 371 (c)(1),
(2), (4) Date: Aug. 30, 2012

(87) PCT Pub. No.: WO2014/003613
PCT Pub. Date: Jan. 3, 2014

(65) Prior Publication Data
US 2014/0004805 A1    Jan. 2, 2014

(51) Int. Cl.
*H04B 1/16* (2006.01)

(52) U.S. Cl.
USPC ........ 455/209; 455/118; 455/190.1; 455/207; 455/315; 327/355; 327/356; 327/358; 327/359

(58) Field of Classification Search
CPC ..... H03D 7/1466; H03D 7/1441; H03B 19/00
USPC ........... 455/118, 131, 190.1, 207, 209, 236.1, 455/293, 315, 316, 326, 333; 327/355–359
See application file for complete search history.

(56) References Cited

U.S. PATENT DOCUMENTS

| | | | |
|---|---|---|---|
| 2008/0020728 A1* | 1/2008 | Zhuo et al. | 455/313 |
| 2008/0139149 A1* | 6/2008 | Mu et al. | 455/200.1 |
| 2009/0197552 A1 | 8/2009 | Kurahashi et al. | |
| 2012/0268190 A1* | 10/2012 | Bellaouar et al. | 327/355 |

FOREIGN PATENT DOCUMENTS

| | | |
|---|---|---|
| WO | 2005027339 A1 | 3/2005 |
| WO | 2008008759 A2 | 1/2008 |
| WO | 2009019633 A2 | 2/2009 |

* cited by examiner

*Primary Examiner* — Tuan Pham
(74) *Attorney, Agent, or Firm* — Murphy, Bilak & Homiller, PLLC

(57) ABSTRACT

The noise response in a passive mixer circuit is improved by discharging the switching transistors in the mixer circuit in an appropriate time slot prior to activation. In addition to improving the noise response, tilt in conversion gains and linearity can be reduced. A passive mixer circuit includes bypass switches arranged in proximity to the switching transistors that make up the mixer core. These bypass switches, which are activated in intervals just prior to the active intervals of their neighboring switching transistors, discharge to ground accumulated charges on the switching transistors or on reactive components around switches.

16 Claims, 9 Drawing Sheets

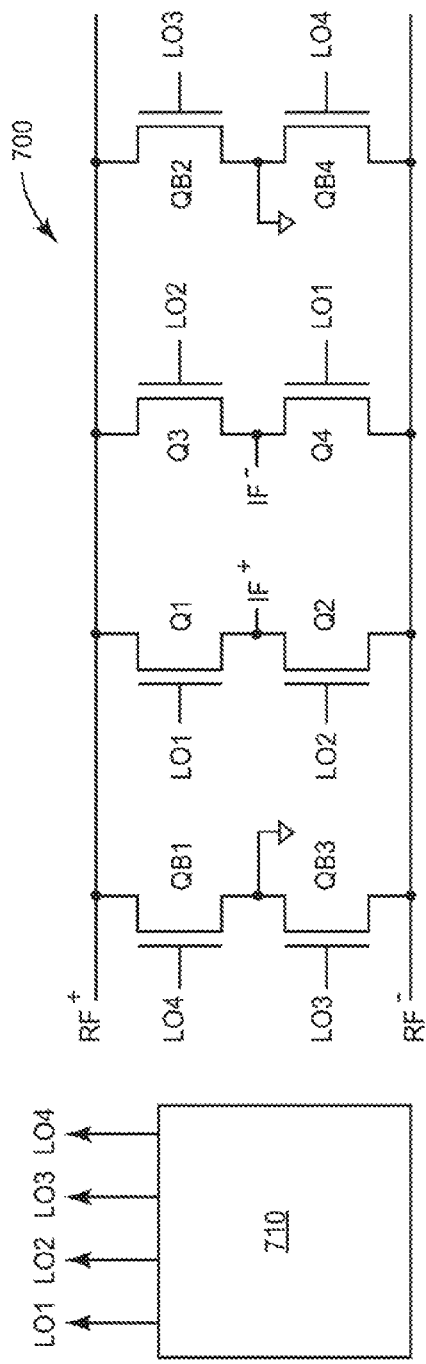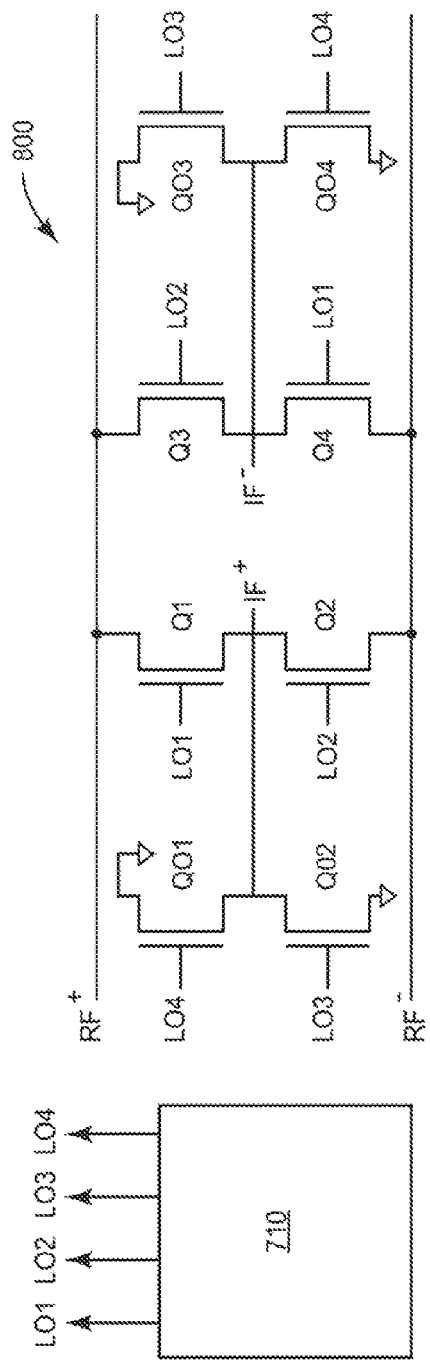

NOISE REDUCTION AND TILT REDUCTION IN PASSIVE FET MULTI-PHASE MIXERS

TECHNICAL FIELD

The present invention generally relates to mixer circuits, such as mixer circuits used in communication signal processing, and particularly relates to passive, multi-phase mixer circuits.

BACKGROUND

The introduction by the 3$^{rd}$-Generation Partnership Project (3GPP) of standards for the Long-Term Evolution (LTE) and LTE-Advanced wireless communication have stimulated further interest in the design of multi-mode, multi-band radio transceivers. The direct conversion receiver, also known as the homodyne receiver, is central to the multi-band approach to multi standards transceiver architecture.

It is well known that flicker noise of the down-conversion mixer in a homodyne (zero-IF) receiver appears in the baseband, at the signal band of interest. Interest in reduced flicker noise has been one of the driving forces behind recently renewed attention to passive mixer circuits.

In mature mixer designs, based on Gilbert-type active mixers, switching transistors driven with DC bias current steer the radio frequency (RF)-to-baseband conversion. However, flicker noise at the output of the mixer is proportional to the DC current through Switches. Another limiting factor to the performance of the Gilbert-cell mixer is the voltage-to-current conversion circuitry used in these mixers. This circuitry puts limits on the linearity of the RF-to-baseband conversion.

For these and other reasons, the passive FET (field-effect transistor) mixer topology (typically based on the metal-oxide-semiconductor FET, or MOSFET, or, somewhat more generally, based on the insulated-gate FET, or IGFET) offers potential improvements in noise (low flicker-noise corner) and better linearity response, compared to the active Gilbert-cell mixer. FIG. 1 illustrates an example of a four-phase passive mixer with in-phase (I) and quadrature (Q) outputs. Two passive mixer branches comprising four transistors each are connected in parallel and operated in quadrature. Thus, each transistor will be activated when a local oscillator (LO) signal at its gate has a sufficiently positive value, i.e., when the LO signal voltage exceeds the threshold value of the FET. Each mixer branch is connected to provide signal paths from input signal terminals RF$^+$/RF$^-$ to first and second intermediate frequency (IF) terminals IF$_I$ and IF$_Q$. Conventionally, the first mixer branch is driven by a first signal LO$_I^+$ and its inverse signal LO$_I^-$, having phases $\phi$ and $\phi+\pi$, respectively. The second mixer branch is driven by a second LO signal LO$_Q^+$ and its inverse signal LO$_Q^-$, having phases $\phi+\pi/2$ and $\phi+3\pi/2$, respectively.

In operation, two LO signals in the circuit of FIG. 1 will have positive values simultaneously. Although the transistors are operated so that the IF terminals are generating the IF signals alternately, a path (short circuit) is created between the IF terminals of the two mixers when any two LO$_I$ and LO$_Q$ signals are high. For example, this is the case when LO$_I^+$ and LO$_Q^+$ have positive values simultaneously.

Theoretical noise figures for passive FET mixers can be estimated for several possible configurations. One mixer configuration, for example, is a passive two-phase mixer with a resistive In-Phase/Quadrature-Phase (I/Q) split. An example of this configuration is shown in FIG. 2. Assuming a 1:2 balun, this mixer configuration has the following minimum theoretical noise figure:

$$F=6+(2\pi N/G), \quad (1)$$

where N is balun turn ratio and G is the gain of the signal chain from the RF input of the mixer to the output of the first baseband operational amplifier (op-amp).

As can be seen from Equation (1), the minimum noise figure can never be lower than 6, which is 7.8 dB. Normally the gain in the receiver chain is limited. The gain is adopted by variable gain amplifier, VGA circuitry. A gain of 12.59=22 dB in the chain results in a noise figure of:

$$F_{12.59,twophaseIQ}=6.9982=8.4 \text{ dB}.$$

Another possible configuration is the four-phase mixer with time-split I/Q architecture. An example of this configuration is illustrated in FIG. 3. A timing diagram for LO signals is pictured in FIG. 4. Again assuming a 1:2 balun, the following minimum theoretical noise figures can be calculated:

$$F=2+(\text{sqrt}(2)\pi N/G). \quad (2)$$

Given a gain of 12.59=22 dB in the receiver chain, the resulting noise factor is $F_{12.59,fourphaseIQ}=2.7=4.3$ dB.

Not that the above calculations of noise figures take only thermal noise from the terminations and the first feedback resistor of the first baseband op-amp into account. Only the first upper and lower sidebands are considered. The switching devices are ideal and more noise sources will contribute to the real noise figure.

The above described architectures for resistive I and Q split and four-phase time domain I and Q split look very similar to each other but their functionalities are different. A main difference is in the LO signal, which is a two-phase LO signal in case of the resistively split architecture, versus a four-phase LO signal for the time-split I/Q architecture. Another difference is the resistor termination value at the input side of the mixer, which will be doubled in the case of the resistively split I and Q design. Since both the I and Q mixers are always "on", the input resistor terminations are paralleled and therefore doubled in value compared to the four-phase version, resulting in a noise penalty. This noise penalty is accounted for in expression (1), above.

While existing mixers based on the four-phase passive mixer architecture offer advantages over the Gilbert-cell mixer, techniques are needed to further enhance the noise performance of these passive mixers.

SUMMARY

In several embodiments of the present invention, the noise response in a passive mixer circuit is improved by discharging parasitic capacitances of the switching transistors in the mixer circuit in an appropriate time slot prior to activation. In addition to improving the noise response, tilt in conversion gains and the resulting tilt in third-order intercept point can be reduced, in some embodiments.

In several embodiments of the present invention, a mixer circuit comprises a mixer branch that includes switching transistors and bypass switches. The mixer branch could be used as one branch in a four-phase, I/Q mixer, for example, along with another similar branch. The mixer circuit further includes a local oscillator (LO) circuit, which provides four LO signals, each having the same LO frequency. In some embodiments, these LO signals each have a 25% duty cycle for their active levels, and are phased at 90 degrees relative to one another. In other embodiments, however, the LO signals may have different duty cycles.

In more detail, the mixer branch in these several embodiments includes first and second switching transistors that are connected between a first output signal terminal to first and second input signal terminals, respectively. These first and second switching transistors are arranged to be switched on by active levels of the first and second LO signals respectively. The mixer branch further includes third and fourth switching transistors, which are connected between a second output signal terminal and the first and second input signal terminals, respectively. These third and fourth switching transistors are arranged to be switched on by active levels of the second and first LO signals, respectively.

The LO circuit is arranged, i.e., designed and implemented, to provide the first and second LO signals, at an LO frequency $f_{LO}$, such that each of the first and second LO signals has an active-level duty cycle of less than 50%. Furthermore, the first and second LO signals are separated so as to form first inactive intervals in which neither of the first and second LO signals is at an active level. The LO circuit is further arranged to provide third and fourth, non-overlapping, LO signals, also at the LO frequency $f_{LO}$. These third and fourth LO signals are each at active levels only during respective alternating ones of the first inactive intervals. Circuit configurations for providing multi-phase LO signals are well known; because the details of these circuits are unnecessary to a complete understanding of the present invention, these details are not provided here.

In some variants of the mixer circuit discussed so far, the mixer branch further includes several bypass switches, which are used to discharge unwanted charge accumulations on the switching transistors. In one example circuit, two high-side bypass switches are connected between a circuit ground and the first input signal terminal. In addition, two low-side bypass switches are connected between the circuit ground and the second input signal terminal. These bypass switches are arranged so that at least one of the high-side bypass switches and at least one of the low-side bypass switches are activated, by the third and fourth LO signals during each of the first inactive intervals. Accordingly, some embodiments include a first bypass transistor connected between the first input signal terminal and the circuit ground, proximate to the first switching transistor and arranged so as to be activated by the fourth LO signal, and a second bypass transistor connected between the first input signal terminal and the circuit ground, proximate to the third switching transistor and arranged so as to be activated by the third LO signal. These embodiments also include a third bypass transistor connected between the second input signal terminal and the circuit ground, proximate to the second switching transistor and arranged so as to be activated by the third LO signal, and a fourth bypass transistor connected between the second input signal terminal and the circuit ground, proximate to the fourth switching transistor and arranged so as to be activated by the fourth LO signal.

In other variants of the mixer circuit, the mixer branch includes several output bypass switches, which are also used to discharge unwanted charge accumulations on the switching transistors. While the bypass switches discussed above were connected to the input terminals of the mixer branch, these output bypass switches are instead connected to the output terminals. Thus, several embodiments of the mixer circuit feature output bypass switches that include a first output bypass transistor connected between the first output signal terminal and the circuit ground, proximate to the first switching transistor and arranged so as to be activated by the fourth LO signal, as well as a second output bypass transistor connected between the first output signal terminal and the circuit ground, proximate to the second switching transistor and arranged so as to be activated by the third LO signal. These embodiments further include additional output bypass switches, including a third output bypass transistor connected between the second output signal terminal and the circuit ground, proximate to the third switching transistor and arranged so as to be activated by the third LO signal, as well as a fourth output bypass transistor connected between the second output signal terminal and the circuit ground, proximate to the fourth switching transistor, and arranged so as to be activated by the fourth LO signal.

Any of the mixer branches discussed above can be combined with a similar mixer branch, to produce an I/Q mixer having both an in-phase (I) and quadrature-phase (Q) output. These circuits, and variants thereof, can be used in any of a wide variety of wireless communication devices, such as a mobile telephone or a radio base station.

Of course, the present invention is not limited to the above features and advantages. indeed, those skilled in the art will recognize additional features and advantages upon reading the following detailed description, and upon viewing the accompanying drawings.

BRIEF DESCRIPTION OF THE DRAWINGS

FIG. 7 illustrates a branch of a mixer circuit having input bypass switches, according to some embodiments of the invention.

FIG. 8 illustrates a branch of a mixer circuit having output bypass switches, according to other embodiments of the invention.

DETAILED DESCRIPTION

Figure 5:
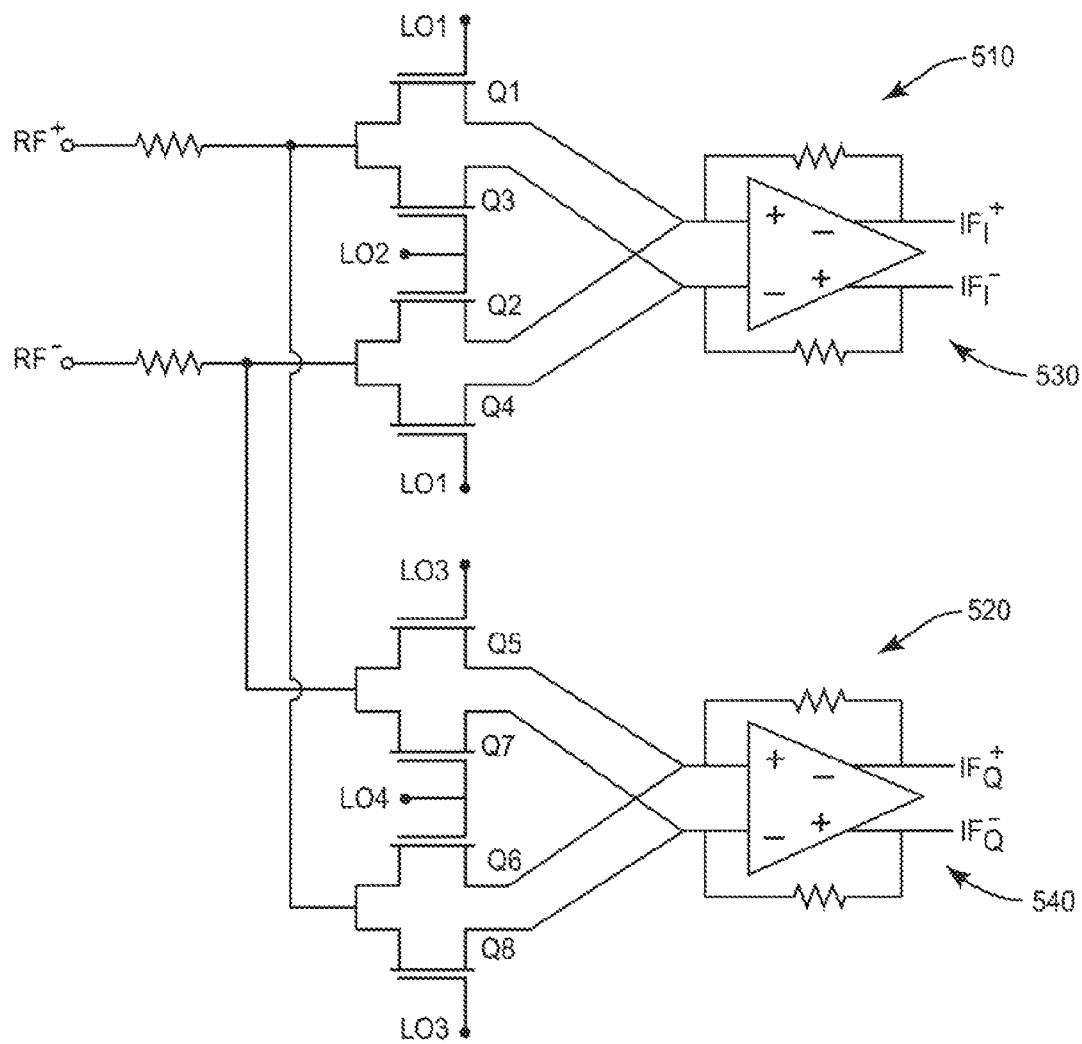
FIG. 5 is another illustration of a four-phase passive mixer circuit.

FIG. 5 illustrates another example of a passive four-phase mixer having a balanced configuration and suitable for use in a homodyne receiver application. The mixer includes an in-phase branch 510 and a quadrature-phase branch 520, the in-phase branch 510 including four switching transistors Q1-Q4 and a differential operational amplifier (op-amp) circuit 530, and the quadrature branch 520 including four switching transistors Q5-Q8 and a differential op-amp circuit 540. The output signals from each branch of the mixer of FIG. 5 drive a differential op-amp, which converts the current supplied by the mixer branch into an output voltage.

Figure 4:
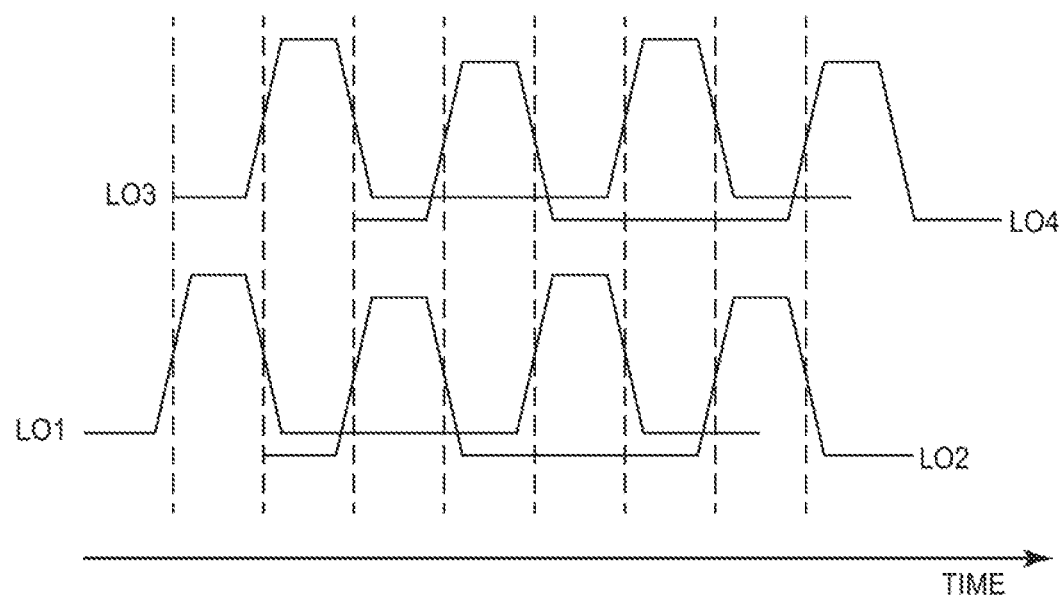
FIG. 4 illustrates local oscillator (LO) signals used in a four-phase passive mixer.

The four-phase local oscillator (LO) signal is realized by 25% duty cycle pulses on each of four local oscillator signal lines LO1-LO4, as shown in FIG. 4, where signals LO1 and LO2 are 180 degrees out of phase with one another, as are signals LO3 and LO4, and where signals LO3 and LO4 lead signals LO2 and LO1, respectively, by 90 degrees. Note that a signal "leads" another when it occurs earlier in time. Assuming an appropriate reference time point in FIG. 4, each pulse in LO3 occurs one-fourth of a cycle earlier in time than the corresponding pulse in signal LO2, while each pulse in LO4 occurs earlier than the corresponding pulse in signal LO1. Theoretically, the four-phase configuration guarantees that there is no simultaneous path between I and Q branches from the input to the baseband.

Figure 6A:
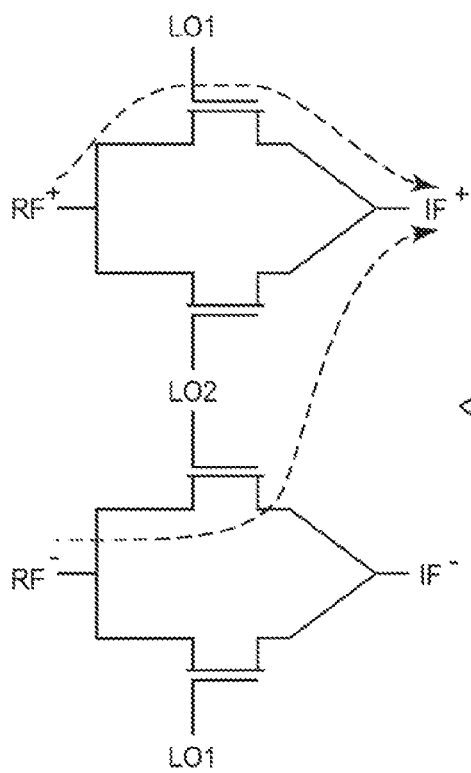
FIGS. 6A and 6B provide simplified equivalent representations of the passive mixer Circuit.
Figure 6B:
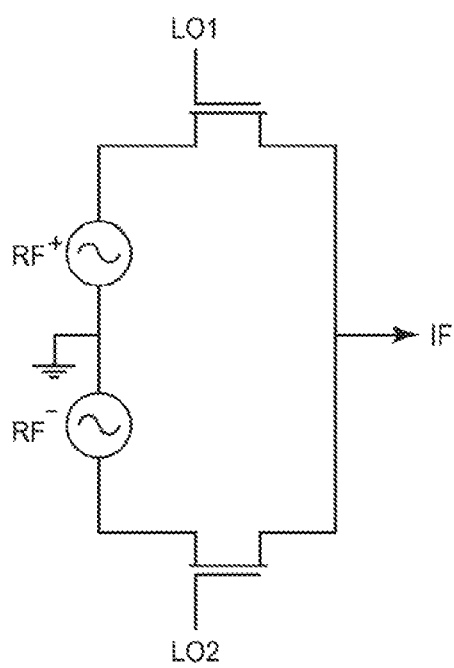

FIG. 6 illustrates a simplified structure to show the passive mixer's functionality, Depending on the polarity of the input radio-frequency (RF) signal in relation to the switching voltages provided by the LO, four pairs of switches generate differential in-phase and quadrature intermediate-frequency (IF) signals, IFQ+, IFQ−, IFI+ and IFI−. For simplicity, FIG. 6A shows only two pair of FETs, corresponding to a single branch of the mixer, while FIG. 6B illustrates the equivalent functionality using only one pair of active switches.

The mixing function shown in FIG. 6 is a voltage commutating function, lacking a transconductance stage, resistors or V/I conversion at the input. This means that the circuit operates through multiplication of the RF signal frequency by voltage switching of the LO frequency. The transistors are altered between their OFF and triode regions by variations in the RF signal relative to LO drive, while the LO signals vary the resistance of the transistors' channels when in triode regions (mainly at rise- and fall-time of the pulses). The large signal swing of the LO signal is to ensure triode operation. Note that while the several circuits disclosed herein are based on the current commutating architecture, the principles and functionality of the voltage-commutating architecture are quite similar. Accordingly, the principles and techniques described herein may be beneficially applied to circuits based on that architecture as well.

The characteristics of the LO pulses affect noise figure and linearity of the mixer. It is desirable that the channel resistance, $R_{DS,ON}$ of the transistors should be constant instantaneously and perfectly during mixing operation. In reality, of course, the rise and fall times of the LO pulses are not instantaneous, this means that the LO pulses' slew rate degradation (with frequency and temperature) directly affects the linearity and noise performance.

While existing mixers based on the four-phase passive mixer architecture offer advantages over the resistively-split I/Q mixer and over the Gilbert-cell mixer, techniques are needed to further enhance the noise performance of these passive mixers. Several of the techniques described herein are based on a hypothesis that a switch-capacitor phenomenon in the passive mixer circuit plays a major role in charge accumulation and charge transport, affecting noise performance when the accumulated charges on the reactive components of the non-active transistor's parasitic degrade the noise performance of the active switching transistors in the mixer core, through modulation of the baseband noise gain.

Figure 1:
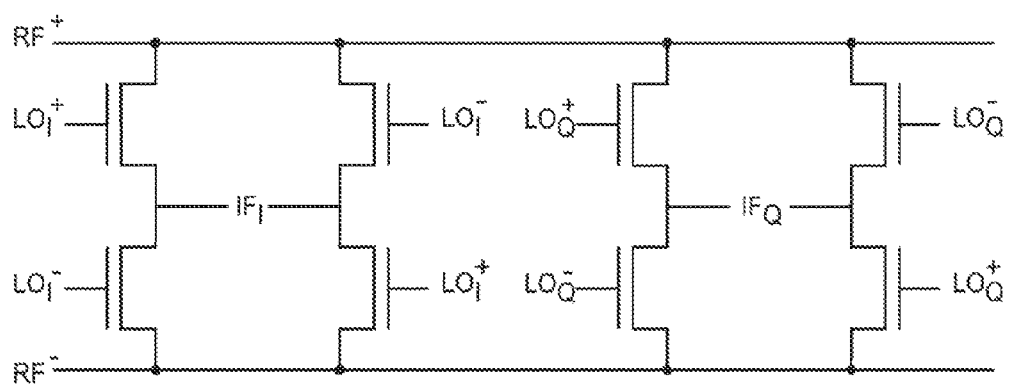
FIG. 1 illustrates a passive mixer circuit providing in-phase and quadrature outputs.
Figure 2:
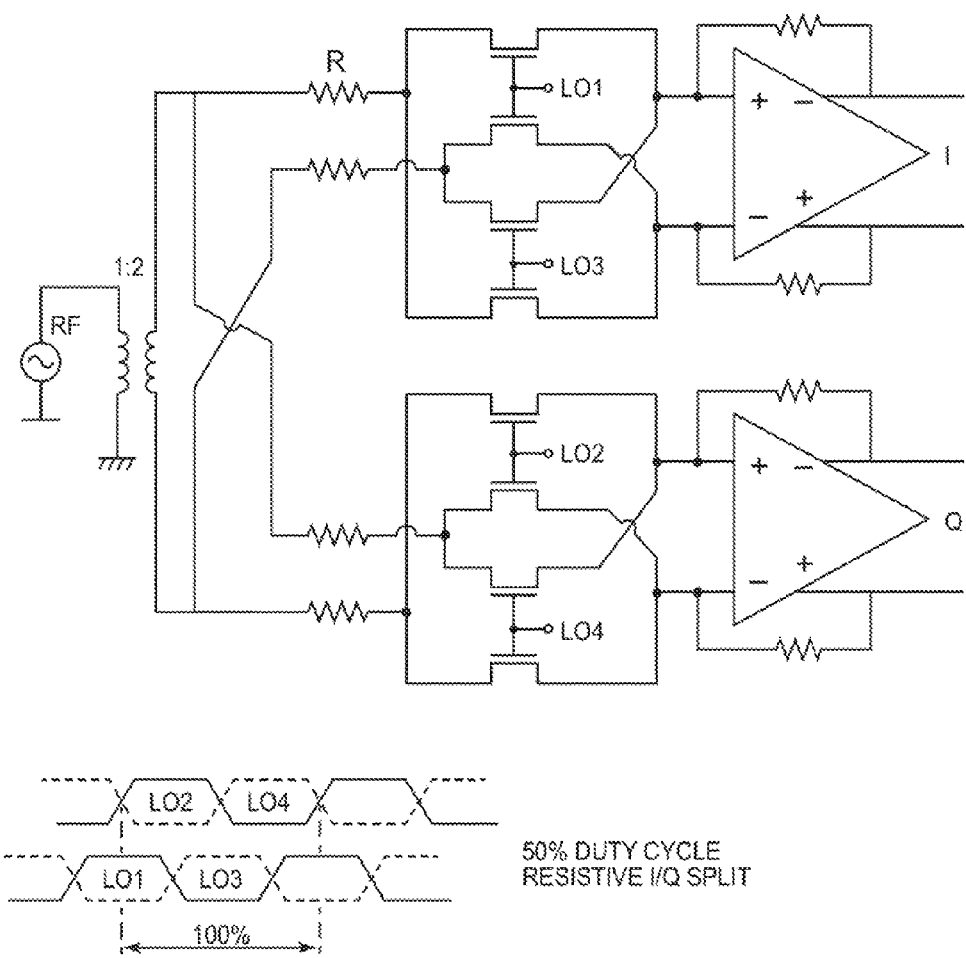
FIG. 2 is a schematic diagram of a two-phase passive I/Q mixer circuit.
Figure 3:
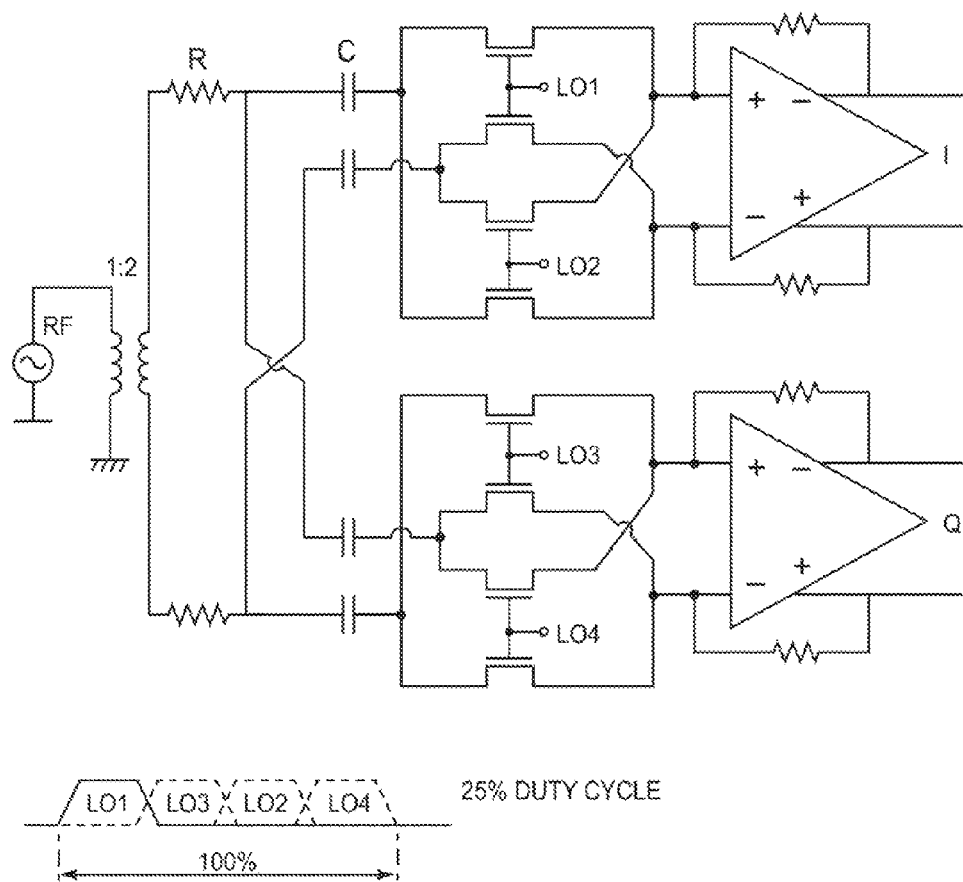
FIG. 3 is a schematic diagram of a four-phase passive I/Q mixer circuit.

One possible way to address this problem is to "screen" the switching transistors from one another, by changing the placement of the input resistor terminations, and hence lowering the noise level. This change in resistor placement, while keeping the original impedances intact, is quite feasible in the case of the four-phase time-split I/Q mixer version. In this case, the termination resistors at the RF input of the circuit are moved partly or entirely to the I and Q branches, instead of being shared by both I and Q branches, as is the case in FIG. 3.

However, a drawback of this screening technique is a device reliability issue, as the voltage drop over non-active switching devices in the mixer core may exceed the breakdown voltage of the FET switches. This happens because there is no voltage drop over the shifted resistors, since there is no current flowing in the non-active signal paths, under non-active timeslot of these branches, and hence the FET devices need to withstand the entire voltage caused by the input signal.

Another problem with the conventional current-driven four-phase passive FET mixer is the lack of reverse isolation, due to the passive nature of the circuit. This lack of reverse isolation between baseband and RF parts in an I/Q modulator can cause mutual interaction between I and Q channels, which potentially causes different conversion on the high- and low-sidebands of the frequency conversion. With this phenomenon, an input signal is down converted to baseband by the mixer, but the signal from baseband is up converted to RF in the same time slot, and interacts with the voltage and current at the RF port of the mixer. Further, the same phenomena can cause nonlinearity at the input of one channel, e.g., the in-phase channel, to leak to the quadrature channel, affecting the linearity of both channels.

In several embodiments of the present invention, the noise response in a passive mixer circuit is improved by discharging the switching transistors in the mixer circuit in an appropriate time slot prior to activation.

In addition, in some embodiments, tilt in conversion gain can be reduced and the input third-order intercept point (IIP3) of the mixer will be a more predictable quantity. More particularly, it has been shown that in some embodiment because of I/Q cross talk in the four-phase passive FET mixer, there is a circulating image current from I to Q channel. There are two current phasors at I channel, low- and high-side, and two phasors at Q channel. The currents at main frequency, i.e., the high-side, are equal in amplitude and in phase but those at image frequency have equal amplitude when anti-phase. This results in a circulating current between I and Q at image frequency. More particularly, in the passive I/Q mixer without any isolating circuitry between I and Q branches, this RF current at image frequency is circulated from the I to Q channel, resulting in a gain conversion different between low- and high-side frequencies. Furthermore, the third order input intercept point, IIP3, are different for low- and high-side frequencies, the latter because of tilting of the low- and high-side conversion gains.

In some of the improved circuits described herein, the circulating image current is simply shorted to analog ground. This ground path will be provided by shorted bypass switches activated at the right time slot to bypass the image current. The quality of the shorted path is a trade off between path's low resistivity to ground and RF signal attenuation.

FIG. 7 illustrates an example circuit according to some embodiments of the present invention. The illustrated circuit may use Metal Oxide Semiconductor Transistors (MOST), for example, in a balanced architecture. The pictured circuit and others described herein are suitable for implementation in an Application Specific integrated Circuit, ASIC, that utilizes an appropriate semiconductor process for providing the MOST technology.

The pictured circuit includes a mixer branch 700, which includes switching transistors Q1-Q4 and bypass switches QB1-QB4. Mixer branch 700 could be used as one branch in a four-phase, I/Q mixer, for example, along with another similar branch.

Also illustrated in FIG. 7 is a local oscillator (LO) circuit 710, which provides four LO signals LO1, LO2, LO3, and LO4, each having the same LO frequency $f_{LO}$. In some embodiments, these LO signals LO1-LO4 each have a 25% duty cycle for their active levels, and are phased as shown in FIG. 4. In other embodiments, however, as will be discussed in more detail below, LO signals LO1-LO4 may have different duty cycles. Because techniques for generating signals of this sort are well known to those skilled in the art, further details of LO circuit 710 are not shown in FIG. 7 and are not described herein.

Looking at FIG. 7 in more detail, it can be seen that mixer branch 700 includes first and second switching transistors Q1 and Q2, which are connected between first output signal terminal IF+ to first and second input signal terminals RF+ and RF−, respectively, These switching transistors Q1 and Q2 are arranged to be switched on by active levels of the first and second LO signals LO1 and LO2, respectively. Mixer branch 700 further includes third and fourth switching transistors Q3 and Q4, which are connected between a second output signal terminal IF− to the first and second input signal terminals RF+ and RF−, respectively. These switching transistors Q3 and Q4 are arranged to be switched on by active levels of the second and first LO signals LO2 and LO1, respectively. Thus it will be appreciated that Q2 and Q3 are switched on and off together, as are Q1 and Q4.

LO circuit 710 is arranged to provide the first and second LO signals LO1 and LO2, at an LO frequency $f_{LO}$, such that each of the first and second LO signals LO1 and LO2 has an active-level duty cycle of less than 50%. Furthermore, the first and second LO signals LO1 and LO2 are separated so as to form first inactive intervals in which neither of the first and second LO signals LO1 and LO2 is at an active level. LO circuit 710 is further arranged to provide third and fourth, non-overlapping, LO signals LO3 and LO4, also at the LO frequency $f_{LO}$. LO3 and LO4 are each at active levels only during respective alternating ones of the first inactive intervals.

The LO signals pictured in FIG. 4, which are each 25% duty cycle signals and are separated from one another by 90 degrees, meet all of these criteria. LO1 and LO2 each have an active-level (high) duty cycle of 25%, which is less than 50%. LO1 and LO2 are separated from one another by 180 degrees, so that there are intervals between them in which neither is active. Finally, signals LO3 and LO4 are active (high) only during these inactive intervals for LO1 and LO2.

Referring back to FIG. 7, mixer branch 700 further includes several bypass switches QB1-QB4, which are used to discharge unwanted charge accumulations on the switching transistors Q1-Q4. In the pictured example, two high-side bypass switches QB1 and QB2 are connected between a circuit ground and the first input signal terminal RF+. In addition, two low-side bypass switches QB3 and QB4 are connected between the circuit ground and the second input signal terminal RF−. Generally speaking, these bypass switches should be arranged so that at least one of the high-side bypass switches QB1 and QB2 and at least one of the low-side bypass switches QB3 and QB4 are activated, by the third and fourth LO signals LO3 and LO4 during each of the first inactive intervals. In the configuration specifically illustrated in FIG. 7, QB1 and QB4 are simultaneously activated during one inactive interval, i.e., by LO4, while QB2 and QB3 are activated during the other inactive interval, by LO3.

It should be appreciated that the terms "high-side" and "low-side" are used herein to indicate whether a component is connected Co the "positive" or "negative" side, respectively, of a differential signal, such as RF+ and RF−. Of course, it will be further appreciated that the "positive" and "negative" designations for these differential signals can be arbitrary. Thus, the terms "high-side" and "low-side" are intended merely as a convenient way to distinguish one component or group of components from another.

When considering the schematic of FIG. 7, it is apparent that QB1 and QB2 are connected between the same circuit nodes, i.e., RF+ and ground. Likewise, QB3 and QB4 are both connected between RF− and ground. In principle, then, only a single bypass switch might be used between RF+ and ground, provided that it is configured to be activated during each of the inactive intervals between LO1 and LO2, i.e., by both LO3 and LO4. Likewise, a single bypass switch might be used between RF− and ground, again provided that it is configured to be activated by both LO3 and LO4. However, it will be appreciated by those skilled in the art that the performance of the circuit at high frequencies will be sensitive to the physical placement of the bypass switches. Accordingly, as suggested by FIG. 7, it may be advantageous to ensure that QB1 is attached to RF+ at a point that is physically proximate to Q1, that QB3 is physically proximate to Q2, that QB2 is physically proximate to Q3, and that QB4 is physically proximate to Q4.

Furthermore, it will be appreciated that any of the bypass switches QB1-QB4 can be implemented using a single switching device or two or more devices connected in parallel and/or in series. Although FET switches are illustrated in FIG. 7, other switching devices are possible. Those skilled in the art will appreciate that the on-impedance of the switching devices will affect the RF performance of the mixer circuit, since each input bypass switch also shunts one of the input signal terminals RF+ and RF− to ground when active. Accordingly, the bypass switches' characteristics should be selected to balance the loss to the input signal against the improvements in noise. If FET switches are used, they should generally be smaller than the FETs used for the switching transistors of the mixer core (Q1-Q4), so as to have higher on-resistance. Alternatively, the impact of the bypass switch to the input signal can be reduced by shortening their on-time, e.g., by shortening the pulses used to activate the bypass switches, relative to the pulses that activate the switching transistors of the mixer core. One example of this approach is discussed below.

With the arrangement of bypass switches pictured in FIG. 7, and with LO3 and LO4 leading LO2 and LO1, respectively, by about 90 degrees, each bypass switch discharges charge accumulated on at least one switching transistor just before that switching transistor is activated. For example, LO4 activates QB1 in the interval just before Q1 is activated (by LO1), allowing QB1 to discharge any charges built up on the inactive Q1. Likewise, LO4 activates QB4 just before Q4 is activated by LO1. Similarly, LO3 activates QB3 and QB2 in an interval just before switching transistors Q2 and Q3 are activated by LO2.

As noted above, each of the LO signals LO1-LO4 can be a 25% duty cycle signal, with, for example, LO3 and LO4 leading LO1 and LO2, respectively, by 90 degrees. However, when considering just a single branch as pictured in FIG. 7, it is also possible to shorten the LO signals used to activate the bypass switches, i.e., LO3 and LO4. In some cases, for example, LO3 and LO4 might be operated at a 12.5% duty cycle, or even less. This approach has the advantage of reducing the proportion of time that the input signals are shorted to ground, thus effectively reducing the circuit's conversion loss.

The bypass configuration illustrated in FIG. 7 is particularly appropriate for a mixer branch that drives a low-impedance load, such as a mixer branch driving an operational amplifier circuit. In the circuit of FIG. 7, the bypass devices are placed on the input side of the mixer. FIG. 8 illustrates a different bypass configuration according to some embodiments of the present invention, where bypass devices are positioned at the output side of the mixer circuit. This approach is particularly suitable for circuits having higher impedance terminations at the baseband/IF output. However, the configurations illustrated in FIGS. 7 and 8 are not limited to low-impedance and high-impedance load situations, and may be suitable for other applications as well. Further, it should be appreciated that some circuits may use both configurations, e.g., with bypass devices QB1-QB4 positioned on the input side of the mixer circuit and output bypass devices QO1-QO4 arranged on the output side.

Looking at FIG. 8 in more detail, it can be seen that the illustrated mixer branch 800, like the mixer branch 700 illustrated in FIG. 7, includes first and second switching transistors Q1 and Q2 connected from a first output signal terminal IF+ to first and second input signal terminals RF+ and RF−, respectively. Once again, these switching transistors Q1 and Q2 are arranged to be switched on by active levels of the first and second LO signals LO1 and LO2, respectively. Mixer branch 800 further includes third and fourth switching transistors Q3 and Q4, which are connected between a second output signal terminal IF− and the first and second input signal terminals RF+ and RF−, respectively. These switching transistors Q3 and Q4 are arranged to be switched on by active levels of the second and first LO signals LO2 and LO1, respectively.

LO circuit 710 operates in the same manner as discussed earlier. Thus, LO circuit is generally arranged to provide the first and second LO signals LO1 and LO2, at an LO frequency $f_{LO}$, such that each of the first and second LO signals LO1 and LO2 has an active-level duty cycle of less than 50% and so that the first and second LO signals LO1 and LO2 are separated so as to form first inactive intervals in which neither of the first and second LO signals LO1 and LO2 is at an active level, LO circuit 710 is further arranged to provide third and fourth, non-overlapping, LO signals LO3 and LO4, also at the LO frequency $f_{LO}$. LO3 and LO4 are each at active levels only during respective alternating ones of the first inactive intervals.

Mixer branch 800 further includes several output bypass switches QO1-QO4, which are used to discharge unwanted charge accumulations on the switching transistors Q1-Q4. While the bypass switches QB1-QB4 in FIG. 7 were connected to the input terminals of the mixer branch, output bypass switches QO1-QO4 are instead connected to the output terminals. Thus, looking more closely at FIG. 8, the output bypass switches include a first output bypass transistor QO1 connected between the first output signal terminal IF+ and the circuit ground, proximate to the first switching transistor Q1 and arranged so as to be activated by the fourth LO signal LO4, as well as a second output bypass transistor QO2 connected between the first output signal terminal IF+ and the circuit ground, proximate to the second switching transistor Q2 and arranged so as to be activated by the third LO signal LO3. Mixer branch 800 further includes additional output bypass switches, including a third output bypass transistor Q03 connected between the second output signal terminal IF− and the circuit ground, proximate to the third switching transistor Q3 and arranged so as to be activated by the third LO signal LO3, as well as a fourth output bypass transistor QO4 connected between the second output signal terminal IF− and the circuit ground, proximate to the fourth switching transistor Q4, and arranged so as to be activated by the fourth LO signal LO4.

Figure 9:
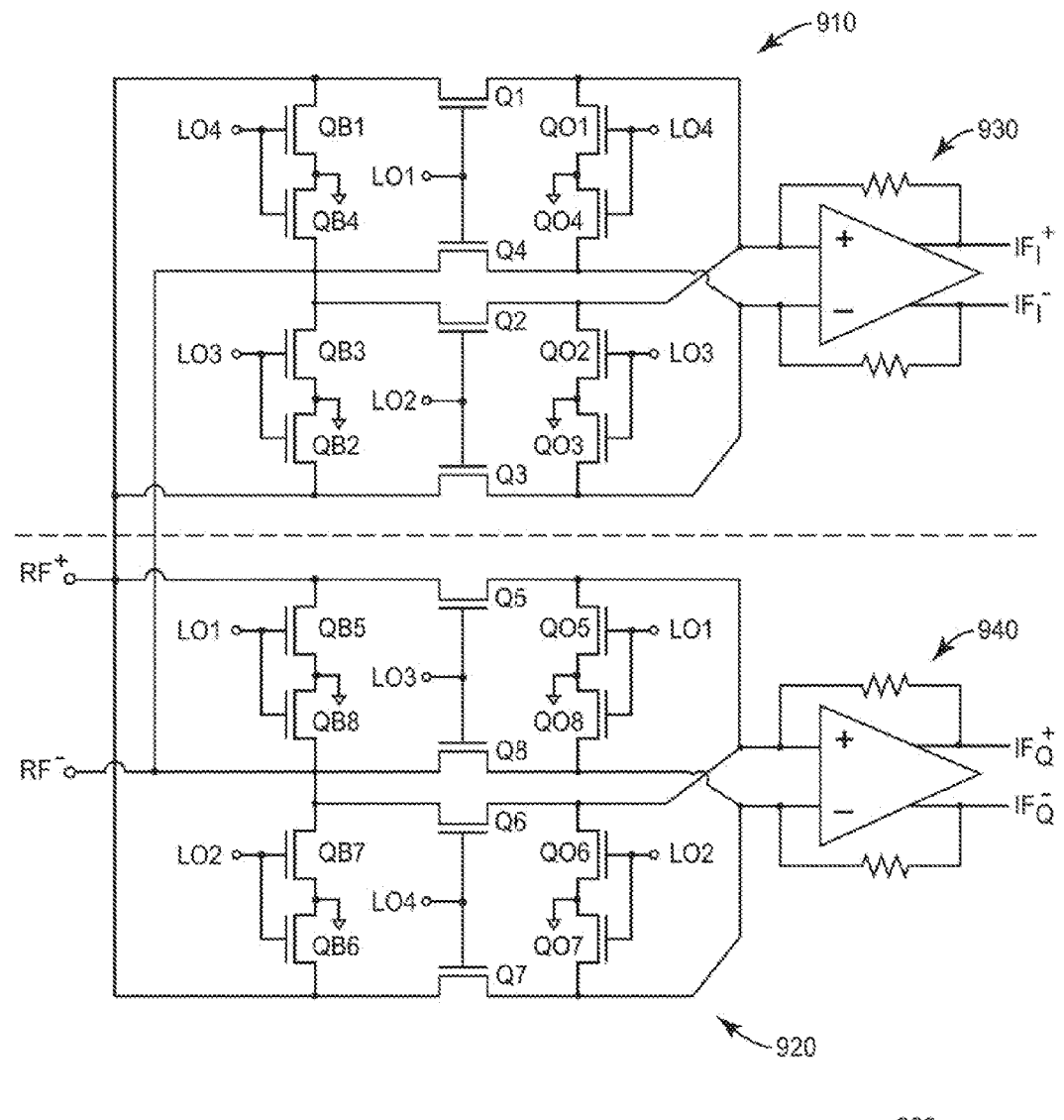
FIG. 9 is a schematic diagram of an example mixer circuit having an in-phase branch and a quadrature branch, according to some embodiments of the invention.

FIGS. 7 and 8 each illustrate only a single mixer branch, which provides a differential IF or baseband output signal. However, either of these circuits can be combined with a similar mixer branch to produce an I/Q mixer having both an in-phase (I) and quadrature-phase (Q) output. An example of this approach is shown in FIG. 9, where a mixer 900 includes a first mixer branch 910 that contains switching transistors Q1-Q4 and input bypass switches QB1-QB4, like the mixer branch 700 shown in FIG. 7, as well as output bypass switches QO1-QO4, like the mixer branch 800 illustrated in FIG. 8. Mixer branch 910 feeds an operational amplifier circuit 930, which produces a differential in-phase output signal IF_I+/IF_I−.

Mixer 900 further includes a second mixer branch 920, which is arranged to provide a quadrature output at first and second quadrature output signal terminals IF_Q+ and IF_Q−, via operational amplifier circuit 940. The second mixer branch 920 includes fifth and sixth switching transistors Q5 and Q6 connected from the first quadrature output signal terminal IF_Q+ to the first input signal terminal RF+ and the second input signal terminal RF−, respectively, and arranged to be switched on by active levels of the third and fourth LO signals LO3 and LO4, respectively. Mixer branch 920 further includes seventh and eighth switching transistors Q7 and Q8, which are connected from the second quadrature output signal terminal IF_Q− to the first input signal terminal RF+ and the second input signal terminal RF−, respectively, and arranged to be switched on by the fourth and third LO signals LO4 and LO3, respectively. Thus, the switching transistors Q5-Q8 are driven by LO3 and LO4, while switching transistors Q1-Q4 are driven by the complementary signals LO1 and LO2.

Mixer branch 920 includes input bypass switches configured in a manner very similar to the comparable switches in mixer branch 700. More particularly, mixer branch 920 includes one or more high-side bypass switches (QB5 and QB6) connected between the circuit ground and the first input signal terminal RF+, as well as one or more low-side bypass switches (QB7 and QB8) connected between the circuit ground and the second input signal terminal RF−, wherein these additional high-side and low-side bypass switches QB5-QB8 are arranged so that at least one of the additional high-side bypass switches and at least one of the additional low-side bypass switches are activated by active levels of the first and second LO signals LO1 and LO2. Mixer branch 920 still further includes output bypass switches QO5-QO8, configured in a like manner on the output side of the mixer core of mixer branch 920. As suggested above, however, the output bypass switches may be omitted on some embodiments. Furthermore, the input bypass switches may be omitted on other embodiments, instead.

As suggested above, the use of the techniques described above in a four-phase, I/Q mixer like the mixer 900 in FIG. 9 can reduce "tilt" in mixer conversion gain. In the current-driven four-phase passive FET mixer without input transcounductance, there is an RF current at the main frequency and also another RF current at the image frequency at the RP port for each of the I and Q channels. These currents are equal for main frequency, while the currents at the image frequency have equal amplitudes but are 180° out of phase with one another. An image current therefore circulates from the I channel to the Q channel.

As it was mentioned above, in passive mixers, a lack of isolation between I/Q channels as well as a lack of isolation between baseband and RF parts may cause mutual interaction between I and Q channels. An input signal is down converted to baseband by mixer, but the baseband signal is up converted to RF in the active time slot, and interacts with the voltage and current at the RF port of the mixer. The interaction between RF and baseband means that the RF impedance as well as baseband impedance and voltage and current at both RF and baseband will play a role in the conversion gain of the receiver.

The above-mentioned circulating image current thus potentially causes different conversion gain on the high- and low-sidebands of the frequency conversion, which in turn causes a "tilt" in conversion gain, i.e., an imbalance between the high- and low-sideband conversion gains. Note, however, that in a homodyne receiver both the high- and low-side conversion frequencies could be wanted signals. For similar reasons, the third order input intercept point, IIP3 may also be different for low-side and high-side frequencies, because the conversion gain is different for the low- and high-side.

Using high input impedance circuits at the baseband side of the mixer can make the gain tilt worse. The bypass switches described in several of the circuits can provide a way to shorten the image current, and thus provide isolation to the circulating current between I and Q channel.

In the discussion above, the operation of each mixer branch illustrated in FIGS. 7, 8, and 9 was explained in the context of a four-phase LO signal. In FIG. 9, two of these mixer branches were combined to produce a four-phase I/Q mixer, which is particularly suitable for zero-IF or near-zero-IF receiver architectures. However, it should be appreciated that the illustrated structures may be used in other ways. For instance, any of the mixer branches shown in FIGS. 7, 8, and 9 can be used with an eight-phase LO signal, where only four of the eight phases are applied to a given branch. Thus, for example, mixer branch 700 or mixer branch 800 can be combined with an LO circuit that is arranged to provide each of LO1, LO2, LO3, and LO4 having a duty cycle of approximately 12.5% and with LO3 and LO4 leading LO2 and LO1, respectively, by 45 degrees. Such a mixer branch can be combined with other branches having similar structures to make an eight-phase I/Q mixer, for example. Other phase relationships are possible, of course, but a goal of this design approach is to activate a bypass switch shortly before the corresponding switching transistor is activated.

Figure 10:
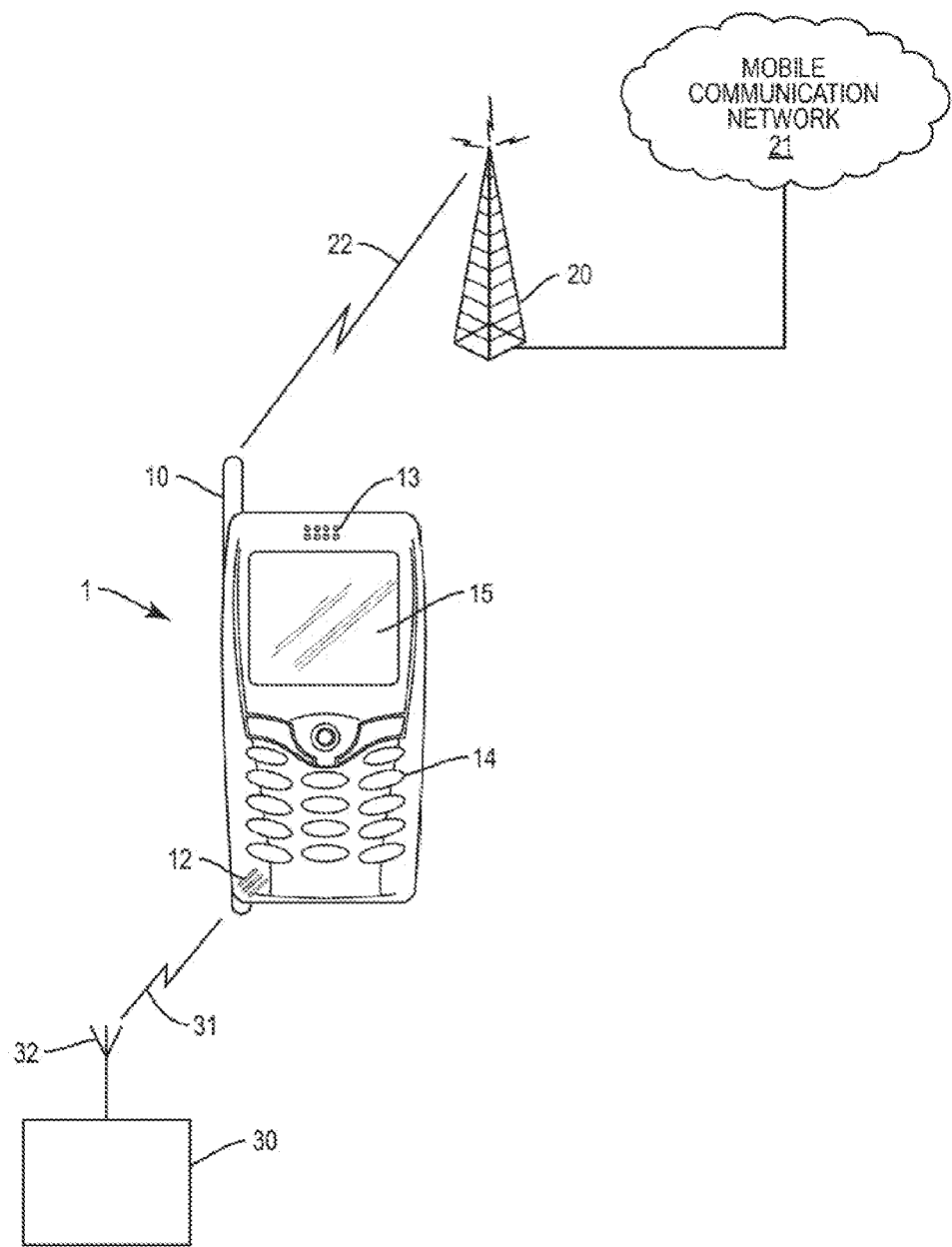
FIG. 10 illustrates a wireless communication device in which the mixer circuits of FIGS. 7, 8, and/or 9 can be used.

FIG. 10 illustrates a wireless communication device 1, e.g., a mobile telephone, as one example of electronic equipment in which any of the various mixers described above may be used, as well as a possible environment in which it may operate. Of course, applications of these mixers are not limited to a wireless communication device 1. Rather, the mixers described herein may be utilized in a wide variety of electronic equipment where a mixer is required for converting a first input signal having a first frequency to a second signal having a second frequency.

Wireless communication device 1 includes an antenna 10. A microphone 12, a loudspeaker 13, a keypad 14, and a display 15 provide a man-machine interface for operating the mobile telephone 1. In operation, the mobile telephone may be connected to a radio station 20 (base station) of a mobile communication network 21, such as a Wideband-CDMA or Long-Term Evolution (LTE) network, via a first radio link 22 and by means of the first antenna 10. Furthermore, the mobile telephone 1 may in operation establish a second wireless link to a peripheral device 30 via a second wireless link 31 by means of the auxiliary antenna 11. The second link 31 might be a Bluetooth™ link for example, which is established in the 2.4 (2.400-2.4835) GHz frequency range.

To establish the wireless links 22, 31, wireless communication device 1 uses radio resources that are adapted according to the relevant wireless technologies and/or standards that are used. Thus, wireless communication device 1 comprises a first radio access means, such as a transceiver, for communicating with the base station 20, and a second radio access means for communicating with the peripheral device 30. The peripheral device 30 may be any device having wireless communicating capabilities, such as according to Bluetooth(™) technology or any other wireless local area network (WLAN) technology. It comprises an antenna 32 for exchanging signals over the second link 31, and a transceiver (not shown) adapted according to the communication technology that the peripheral device 30 uses. The device may be a wireless headset, a remote server, a fax machine, a vending machine, a printer, etc. A wide variety of electronic equipment may have such communication capabilities and have a need for wirelessly transferring of data.

When wireless communication device 1 receives signals at radio frequencies, the RF signals must usually be down converted to a signal having a lower frequency, such as an intermediate frequency (IF) or a baseband frequency, before further signal processing is applied. As mentioned above, many recent receiver designs are based on the homodyne receiver architecture, where the RF signal is converted directly to baseband—these receivers may be called zero-IF or near-zero-IF receivers, in various implementations.

Similarly, an IF or baseband signal may have to be up converted to a signal having a higher frequency, such as an RF frequency, before transmitted. Thus, the radio access means of the mobile telephone 1 may comprise one or several mixers, any or several of which may be configured according to the techniques described above. More particularly, one or more of the circuits described above, or variants thereof, may be incorporated in either a receiver or a transmitter for providing frequency conversion from a first to a second frequency.

Of course, use of the mixers described herein is not limited to transceivers of mobile telephones. These mixer techniques may be applied to radio circuits in base station 20, for example, or in any of a wide variety of wireless communication devices that have a radio communication interface for wireless communication with a remote device.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiment disclosed and that modifications and other embodiments are intended to be included within the scope of this disclosure. Although specific terms may be employed herein, they are used in a generic and descriptive sense only and not for purposes of limitation.

What is claimed is:

1. A passive mixer circuit comprising at least a first mixer branch, the first mixer branch comprising:

first and second switching transistors connected from a first output signal terminal to first and second input signal terminals, respectively, and arranged to be switched on by active levels of first and second local oscillator, (LO) signals, respectively;

third and fourth switching transistors connected from a second output signal terminal to the first and second input signal terminals, respectively, and arranged to be switched on by active levels of the second and first LO signals, respectively;

wherein said passive mixer circuit is characterized by further comprising:

a local oscillator, (LO) circuit arranged to provide the first and second LO signals at an LO frequency, so that each of the first and second LO signals has an active-level duty cycle of less than 50% and so that the first and second LO signals are separated so as to form first inactive intervals in which neither of the first and second LO signals is at an active level, and to provide third and fourth, non-overlapping, LO signals at the LO frequency and that are each at active levels only during respective alternating ones of the first inactive intervals; and one or more high-side bypass switches connected between a circuit ground and the first input signal terminal and one or more low-side bypass switches connected between the circuit ground and the second input signal terminal, wherein the bypass switches are arranged so that at least one of the high-side bypass switches and at least one of the low-side bypass switches are activated, by the third and fourth LO signals, during each of the first inactive intervals.

2. The passive mixer circuit of claim 1, wherein the LO circuit is arranged to provide each of the first, second, third, and fourth LO signals with a duty cycle of approximately 25% and with the third and fourth LO signals leading the second and first LO signals, respectively, by 90 degrees.

3. The passive mixer circuit of claim 1, wherein the LO circuit is arranged to provide each of the third and fourth LO signals with a duty cycle of about 12.5% or less.

4. The passive mixer circuit of claim 1, wherein:
the high-side bypass switches comprise a first bypass transistor connected between the first input signal terminal and the circuit ground, proximate to the first switching transistor and arranged so as to be activated by the fourth LO signal, and a second bypass transistor connected between the first input signal terminal and the circuit ground, proximate to the third switching transistor and arranged so as to be activated by the third LO signal; and
the low-side bypass switches comprise a third bypass transistor connected between the second input signal terminal and the circuit ground, proximate to the second switching transistor and arranged so as to be activated by the third LO signal, and a fourth bypass transistor connected between the second input signal terminal and the circuit ground, proximate to the fourth switching transistor and arranged so as to be activated by the fourth LO signal.

5. The passive mixer circuit of claim 1, further comprising one or more output bypass switches connected between a circuit ground and the first signal output terminal, and one or more additional output bypass switches connected between the circuit ground and the second signal output terminal, wherein the output bypass switches and additional output bypass switches are arranged so that at least one of the output bypass switches and at least one of the additional output bypass switches are activated, by the third and fourth LO signals, during each of the first inactive intervals.

6. The passive mixer circuit of claim 5, wherein:
the output bypass switches comprise a first output bypass transistor connected between the first output signal terminal and the circuit ground, proximate to the first switching transistor and arranged so as to be activated by the fourth LO signal, and a second output bypass transistor connected between the first output signal terminal and the circuit ground, proximate to the second switching transistor and arranged so as to be activated by the third LO signal; and
the additional output bypass switches comprise a third output bypass transistor connected between the second output signal terminal and the circuit ground, proximate to the third switching transistor and arranged so as to be activated by the third LO signal, and a fourth output bypass transistor connected between the second output signal terminal (IF−) and the circuit ground, proximate to the fourth switching transistor, and arranged so as to be activated by the fourth LO signal.

7. The passive mixer circuit of claim 1, further comprising a second mixer branch arranged to provide a quadrature output at first and second quadrature output signal terminals, the second mixer branch comprising:
fifth and sixth switching transistors connected from the first quadrature output signal terminal to the first input signal terminal and the second input signal terminal, respectively, and arranged to be switched on by active levels of the third and fourth LO signals, respectively;
seventh and eighth switching transistors connected from the second quadrature output signal terminal to the first input signal terminal and the second input signal terminal, respectively, and arranged to be switched on by the fourth and third LO signals, respectively; and
one or more additional high-side bypass switches connected between the circuit ground and the first input signal terminal, and one or more additional low-side bypass switches connected between the circuit ground and the second input signal terminal, wherein the additional high-side and low-side bypass switches are arranged so that at least one of the additional high-side bypass switches and at least one of the additional low-side bypass switches are activated by active levels of the first and second LO signals.

8. The passive mixer circuit of claim 1, wherein the LO circuit is arranged to provide each of the first, second, third, and fourth LO signals with a duty cycle of approximately 12.5% and with the third and fourth LO signals leading the second and first LO signals, respectively, by 45 degrees.

9. A wireless communication device having a communication interface for wireless communicating with a remote communication device, the communication interface including a passive mixer circuit having at least a first mixer branch, the first mixer branch comprising:
first and second switching transistors connected from a first output signal terminal to first and second input signal terminals, respectively, and arranged to be switched on by active levels of first and second local oscillator, (LO) signals, respectively;
third and fourth switching transistors connected from a second output signal terminal to the first and second input signal terminals, respectively, and arranged to be switched on by active levels of the second and first LO signals, respectively;
wherein said passive mixer circuit is characterized by further comprising:
a local oscillator, (LO) circuit arranged to provide the first and second LO signals at an LO frequency, so that each of the first and second LO signals has an active-level duty cycle of less than 50% and so that the first and second LO signals are separated so as to form first inactive intervals in which neither of the first and second LO signals is at an active level, and to provide third and fourth, non-overlapping, LO signals at the LO frequency and that are each at active levels only during respective alternating ones of the first inactive intervals; and
one or more high-side bypass switches connected between a circuit ground and the first input signal terminal and one or more low-side bypass switches connected-between the circuit ground and the second input signal terminal, wherein the bypass switches are arranged so that at least one of the high-side bypass switches and at least one of the low-side bypass switches are activated, by the third and fourth LO signals, during each of the first inactive intervals.

10. The wireless communication device of claim 9, wherein the LO circuit is arranged to provide each of the first, second, third, and fourth LO signals with a duty cycle of approximately 25% and with the third and fourth LO signals leading the second and first LO signals, respectively, by 90 degrees.

11. The wireless communication device of claim 9, wherein the LO circuit is arranged to provide each of the third and fourth LO signals with a duty cycle of about 12.5% or less.

12. The wireless communication device of claim 9, wherein:
- the high-side bypass switches comprise a first bypass transistor connected between the first input signal terminal and the circuit ground, proximate to the first switching transistor and arranged so as to be activated by the fourth LO signal, and a second bypass transistor connected between the first input signal terminal and the circuit ground, proximate to the third switching transistor and arranged so as to be activated by the third LO signal; and
- the low-side bypass switches comprise a third bypass transistor connected between the second input signal terminal (RF−) and the circuit ground, proximate to the second switching transistor and arranged so as to be activated by the third LO signal, and a fourth bypass transistor connected between the second input signal terminal and the circuit ground, proximate to the fourth switching transistor and arranged so as to be activated by the fourth LO signal.

13. The wireless communication device of claim 9, further comprising one or more output bypass switches connected between a circuit ground and the first signal output terminal, and one or more additional output bypass switches connected-between the circuit ground and the second signal output terminal, wherein the output bypass switches and additional output bypass switches are arranged so that at least one of the output bypass switches and at least one of the additional output bypass switches are activated, by the third and fourth LO signals, during each of the first inactive intervals.

14. The wireless communication device of claim 13, wherein:
- the output bypass switches comprise a first output bypass transistor connected between the first output signal terminal and the circuit ground, proximate to the first switching transistor and arranged so as to be activated by the fourth LO signal, and a second output bypass transistor connected between the first output signal terminal and the circuit ground, proximate to the second switching transistor and arranged so as to be activated by the third LO signal; and
- the additional output bypass switches comprise a third output bypass transistor connected between the second output signal terminal and the circuit ground, proximate to the third switching transistor and arranged so as to be activated by the third LO signal, and a fourth output bypass transistor connected between the second output signal terminal and the circuit ground, proximate to the fourth switching transistor, and arranged so as to be activated by the fourth LO signal.

15. The wireless communication device of claim 9, wherein the passive mixer circuit further comprises a second mixer branch arranged to provide a quadrature output at first and second quadrature output signal terminals, the second mixer branch comprising:
- fifth and sixth switching transistors connected from the first quadrature output signal terminal to the first input signal terminal and the second input signal terminal, respectively, and arranged to be switched on by active levels of the third and fourth LO signals, respectively;
- seventh and eighth switching transistors connected from the second quadrature output signal terminal to the first input signal terminal and the second input signal terminal, respectively, and arranged to be switched on by the fourth and third LO signals, respectively; and
- one or more additional high-side bypass switches connected between the circuit ground and the first input signal terminal, and one or more additional low-side bypass switches connected between the circuit ground and the second input signal terminal, wherein the additional high-side and low-side bypass switches are arranged so that at least one of the additional high-side bypass switches and at least one of the additional low-side bypass switches are activated by active levels of the first and second LO signals.

16. The wireless communication device of claim 9, wherein the LO circuit is arranged to provide each of the first, second, third, and fourth LO signals with a duty cycle of approximately 12.5% and with the third and fourth LO signals leading the second and first LO signals, respectively, by 45 degrees.

* * * * *

UNITED STATES PATENT AND TRADEMARK OFFICE
CERTIFICATE OF CORRECTION

PATENT NO. : 8,818,310 B2
APPLICATION NO. : 13/581991
DATED : August 26, 2014
INVENTOR(S) : Bagger It is certified that error appears in the above-identified patent and that said Letters Patent is hereby corrected as shown below:

In the specification

Column 2, Line 10, delete "$F_{12.59,twophaseIQ}=6.9982=8.4$ dB." and insert -- $F_{12.59,twophaseIQ}=6.998=8.4$ dB. --, therefor.

Column 2, Line 20, delete "Not" and insert -- Note --, therefor.

Column 5, Line 7, delete "functionality," and insert -- functionality. --, therefor.

Column 7, Line 6, delete "between first" and insert -- between a first --, therefor.

Column 7, Line 58, delete "Co" and insert -- to --, therefor.

Column 10, Line 52, delete "RP port" and insert -- RF port --, therefor.

In the claims

Column 12, Line 60, Claim 1, delete "oscillator," and insert -- oscillator --, therefor.

Column 14, Line 38, Claim 9, delete "oscillator," and insert -- oscillator --, therefor.

Column 14, Line 47, Claim 9, delete "oscillator," and insert -- oscillator --, therefor.

Signed and Sealed this
Seventeenth Day of November, 2015

Michelle K. Lee
*Director of the United States Patent and Trademark Office*